United States Patent
Liebl et al.

(10) Patent No.: US 6,640,166 B2
(45) Date of Patent: Oct. 28, 2003

(54) DIAGNOSTIC TOOL GRAPHICAL DISPLAY APPARATUS AND METHOD

(75) Inventors: Troy J. Liebl, Owatonna, MN (US); Todd G. Hanson, Owatonna, MN (US)

(73) Assignee: SPX Corporation, Charlotte, NC (US)

(*) Notice: Subject to any disclaimer, the term of this patent is extended or adjusted under 35 U.S.C. 154(b) by 74 days.

(21) Appl. No.: 09/944,107

(22) Filed: Sep. 4, 2001

(65) Prior Publication Data

US 2002/0077780 A1 Jun. 20, 2002

Related U.S. Application Data (60) Provisional application No. 60/240,812, filed on Oct. 17, 2000.

(51) Int. Cl.[7] ............................................. G06F 19/00
(52) U.S. Cl. ......................................... 701/29; 340/438
(58) Field of Search ........................... 701/29, 30, 31, 701/32, 33, 34; 340/438, 439

(56) References Cited

U.S. PATENT DOCUMENTS

| | | | | |
|---|---|---|---|---|
| 5,034,893 A | * | 7/1991 | Fisher | 701/99 |
| 5,160,892 A | * | 11/1992 | Makhija et al. | 324/379 |
| 5,541,840 A | * | 7/1996 | Gurne et al. | 701/33 |
| 5,711,021 A | * | 1/1998 | Book | 701/33 |
| 6,049,754 A | * | 4/2000 | Beaton et al. | 701/204 |
| 6,052,456 A | * | 4/2000 | Huang | 379/201.04 |
| 6,097,998 A | * | 8/2000 | Lancki | 701/33 |
| 6,263,268 B1 | * | 7/2001 | Nathanson | 701/29 |
| 6,295,492 B1 | * | 9/2001 | Lang et al. | 701/33 |
| 6,330,499 B1 | * | 12/2001 | Chou et al. | 701/33 |

* cited by examiner

Primary Examiner—Gary Chin
(74) Attorney, Agent, or Firm—Baker & Hostetler LLP (57) ABSTRACT

In a computerized analyzer linked to an onboard computer for complex machinery, a computer-readable binary pattern storage apparatus which has a plurality of binary patterns constituting an application program executable by the computerized analyzer. Sets of instructions in the application program are executable, in response to user input from a graphical user interface, to provide a variety of functions which include: monitoring and processing data received to provide groups of vertical and horizontal graphical coordinates suitable for graphing; displaying graphs on a visual display device from the graphical coordinates; rearranging and highlighting selected graph designations; providing a second horizontal scale to a selected portion of the horizontal graphical coordinates to give a selected graph a zoomed-in appearance; recording and displaying graphical time frames of the groups of graphical coordinates; and permitting the real-time and diagnostic-code-triggered collection, processing, and graphical display of data.

20 Claims, 5 Drawing Sheets

| | | |
|---|---|---|
| IGN CNTRL 24X SIGNAL | 3 | rpm |
| MAF Frequency | 6584.0 | Hz |
| Enigine Run Time | 14617 | hr |
| INJ PULSE WIDTH | 14905 | ms |
| MASS AIR FLOW | 53562 | ? |
| ENGINE SPEED | 18129 | rpm |
| BARO PRESSURE | 70 | kpa |
| HO2S Xcounts Bank 1 | 191 | cnt |
| KNOCK RETARD | 922.5 | Deg |
| Desired EGR Position | 11300 | % |
| Desired Idle Spd | 68 | rpm |
| FT Cell (BLM) | 184 | cnt |

○ Record    🔍 Zoom    ⇧ To Top

FIG. 3

| | | |
|---|---|---|
| IGN CNTRL 24X SIGNAL | 23 | rpm |
| MAF Frequency | 12828.0 | Hz |
| Engine Run Time | 29746 | hr |
| INJ PULSE WIDTH | 2164 | ms |
| MASS AIR FLOW | 56072 | ? |
| ENG SPEED | 6619 | rpm |
| BARO PRESSURE | 25 | kpa |
| HO2S Xcounts Bank 1 | 60 | cnt |
| KNK RETARD | 3510.0 | Deg |
| Desired EGR Position | 3000 | % |

Frame: 0

○ Record    🔍 Zoom    ⇧ To Top

DIAGNOSTIC TOOL GRAPHICAL DISPLAY APPARATUS AND METHOD

RELATED APPLICATION

This application claims priority based upon U.S. Provisional Application No. 60/240,812, filed Oct. 17, 2000, and U.S. application Ser. Nos. 09/702,751 and 09/702,803, both filed Nov. 1, 2000, the disclosures of which are incorporated herein by reference.

FIELD OF THE INVENTION

The present invention relates to monitoring a plurality of data channels and processing and displaying monitored data on a hand-held display apparatus. More particularly, the present invention relates to monitoring a plurality of data channels which carry data relating to a motor vehicle, processing, and displaying the monitored data on a hand-held automotive analyzer apparatus.

BACKGROUND OF THE INVENTION

Proper operation of complex machinery requires proper operation of a large number of systems and subsystems of the machinery. When one or more of those systems and subsystems does not operate properly, it is important to be able to analyze and diagnose problems so that the problems can be remedied. Modern automotive vehicles are exemplary of such complex machinery, and a large number of sensors are provided to monitor a large number of parameters of systems and subsystems that are important to proper operation of an automotive vehicle. Provisions are made for the sensors to operation of an automotive vehicle. Provisions are made for the sensors to provide data to data channels, and the data channels are in communication with a computerized analyzer which receives and processes the sensor-provided data.

Computerized automotive analyzers are generally of two types: large stand alone units; and small, hand-held units. Generally, because of their size and complexity, stand alone analyzers are conventionally capable of more complex data receiving and more complex data processing than hand-held analyzers. However, it would be desirable if a hand-held analyzer were provided with the capabilities of a stand alone analyzer for complex data receiving and complex data processing.

There are plural streams of data provided to a computerized analyzer via plural data channels. Yet, there are times when a technician desires to focus on only one or a relatively small number of data channels at a time. In this respect, it would be desirable if a computerized analyzer were provided which permits a technician to focus on one or a small number of data channels at a time.

Aside from focussing on a relatively small number of selected data channels at time, the technician may have a preferred order for displaying information from the selected data channels. A preferred order for displaying information may relate to a logical sequence of parameters under study. Moreover, the technician may wish to easily change the order for displaying information from the selected data channels. In this respect, it would be desirable if a computerized analyzer were provided which permits a technician to readily change the order of information displayed for selected data channels.

A convenient way to enable a technician to select among graphs that are available for display is to have a displayed list of available graphs. From such a displayed list of available graphs, when specific graphs are selected, it would be desirable if selected graphs are in some way highlighted or distinguished from other members of the displayed list of available graphs.

When a two-dimensional graph is displayed, often the graph has a horizontal axis and a vertical axis. Often the horizontal axis depicts measurements of time, and the vertical axis depicts measurements of a parameter that changes over the course of time. For a given graph, a single scale of time on the horizontal axis is generally selected. However, it has been realized by the present inventors that it would be desirable to be able to have a graphical display in which the time scale can be changed for a portion of the horizontal axis. For example if a selected graph shows the measurement of a parameter versus time in seconds, it may be desirable if a portion of the horizontal axis would show the measurement of the selected parameter versus time in tenths of a second. When a second time scale is more detailed than a first time scale, for a portion of the horizontal axis of the graph, the portion of the more detailed second time scale is in a sense magnified with respect to the first time scale. Another way of stating this relationship between the second time scale and the first time scale is that the second time scale is zoomed-in with respect to the first time scale. In this respect, it would be desirable if a computerized analyzer were provided in which a display can display a graph that has a first portion of the graph, which employs a first time scale, and which has a second portion of the graph, which employs a zoomed-in time scale.

Thus, while the foregoing discussion indicates it to be well known to use computerized data monitoring and analysis for complex machinery or equipment, there is no teaching or suggestion of a data monitoring and analysis method and apparatus which has the following combination of desirable features: (1) provides a hand-held analyzer having the capabilities of a stand alone analyzer for complex data receiving and complex data processing; (2) permits a technician to focus on one or a small number of data channels at a time; (3) permits a technician to readily change the order of available graphs; (4) provides a way for selected data channels to be highlighted or distinguished from other members of the displayed list of data channels; (5) provides a graphical display in which the time scale can be changed for a portion of the horizontal axis; and (6) can display a graph that has a first portion of the graph, which employs a first time scale, and which has a second portion of the graph, which employs a zoomed-in time scale.

The foregoing desired characteristics are provided by the unique data monitoring and analysis method and apparatus of the present invention as will be made apparent from the following description thereof. Other advantages of the present invention over the prior art also will be rendered evident.

SUMMARY OF THE INVENTION

In a data monitoring and analysis method and apparatus for complex machinery, a plurality of sensors provide data to an onboard computer. The onboard computer has a port for receiving a data link connector for connecting to a computerized analyzer, and the onboard computer port provides a plurality of data channels to the data link connector and to the computerized analyzer The computerized analyzer includes a computer-readable binary pattern storage apparatus which has a plurality of binary patterns constituting an application program executable by a computer. The computer has a central microprocessor, a memory, means for loading the application program into a defined address space of the memory, an operating system which provides a graphical user interface, and a visual display device controlled by the application program and by a user employing the graphical user interface.

The invention provides a computer-readable binary pattern storage apparatus which has a plurality of binary patterns constituting an application program executable by a computer. The computer has a central microprocessor, a memory, for loading the application program into a defined address space of the memory, an operating system providing a graphical user interface, and a visual display controlled by the application program and by a user using the graphical user interface. The computer is connected to a plurality of data channels. The computer-readable binary pattern storage apparatus is housed in a hand-held computerized analyzer. The application program includes a plurality of sets of instructions with each set executable by the microprocessor.

The sets of instructions in the application program include as follows.

A set of monitoring instructions is executable to monitor data received from a data channel and to monitor time.

A set of data and time processing instructions is executable to process the received data and the monitored time into groups of information suitable for display on the visual display device. Also, the set of data and time processing instructions are executable to provide a list of information designations on the visual display device for the groups of information that can be displayed on the visual display device. The groups of information include groups of graphical coordinates suitable for graphing, and the list of information designations includes graph designations which designate graphs that can be displayed on the visual display device from the graphical coordinates.

A set of list rearrangement instructions is executable to be responsive to the graphical user interface to permit the user to rearrange the list of the information designations displayed on the visual display device.

A set of graph selection instructions is executable to be responsive to the graphical user interface and responsive to selected graph designations to provide a group of selected graphs to be displayed in a graphical display mode.

A set of graph display instructions is executable to be responsive to the graph selection instructions for displaying the group of selected graphs on the visual display device.

In accordance with another aspect of the invention, a set of highlighting instructions is executable to be responsive to the selected graphs to be displayed in a graphical display mode. The highlighting instructions cause the group of selected graphs to be highlighted on the visual display device.

In accordance with another aspect of the invention, a set of graph display instructions is executable to be responsive to the graph selection instructions for displaying the group of selected graphs on the visual display device, wherein each graph is displayed has a vertical scale for the vertical graphical coordinates and has a first horizontal scale for the horizontal graphical coordinates.

A set of graph scale changing instructions is executable on a portion of the horizontal graphical coordinates, which has the first horizontal scale of a selected graph that is selected by the user employing the graphical user interface, for providing a second horizontal scale to the selected portion of the horizontal graphical coordinates. The second horizontal scale is larger than the first horizontal scale, and as a result, the graph that is displayed has a zoomed-in appearance.

In accordance with yet another aspect of the invention, a set of time frame recording instructions is executable to be responsive to the graphical user interface to permit the user to select recording of graphical time frames of the groups of graphical coordinates. The graphical time frames are suitable for graphing.

A set of time frame selection instructions is executable to be responsive to the graphical user interface to permit the user to select recorded graphical time frames to be displayed in a graphical display mode on the visual display device.

In accordance with still another aspect of the invention, a set of real-time data collection instructions is executable to be responsive to the graphical user interface to permit the real-time collection of data, processing of data, and displaying real-time processed data graphically.

In accordance with another aspect of the invention, a set of diagnostic-code-triggered data collection instructions is executable to be responsive to the graphical user interface to permit the collection of data, processing of data, and displaying processed data graphically in response to a diagnostic code trigger.

A set of trigger line display instructions is executable in response to the diagnostic-code-triggered data collection, for graphing a trigger line the diagnostic-code-triggered graphs on the visual display device.

In accordance with another aspect of the invention, a method is provided for displaying data from a plurality of data channels and for displaying information processed from the data on a visual display device which is responsive to a graphical user interface. The method includes the steps of: monitoring sensed data received from the plurality of data channels and monitoring time; processing the sensed data and the monitored time into groups of information suitable for display on the visual display device; and listing information designations on the visual display device for the groups of information that can be displayed on the visual display device. The groups of information include groups of graphical coordinates suitable for graphing, and the list of information designations includes graph designations which designates graphs that can be displayed on the visual display device from the graphical coordinates.

In accordance with another aspect of the invention, the method includes the steps of: rearranging the information designations in the list on the visual display device by a user employing the graphical user interface; selecting information designations by the user employing the graphical user interface to provide a group of selected graphs to be displayed in a graphical display mode on the visual display device; and displaying, by the user employing the graphical user interface, the group of selected graphs on the visual display device.

In accordance with another aspect of the invention, method includes the steps of: highlighting the selected information designations by the user employing the graphical user interface to provide a group of selected graphs to be displayed in a graphical display mode on the visual display device; and displaying the highlighted group of selected graphs on the visual display device, one at a time, by the user employing the graphical user interface.

In accordance with another aspect of the invention, the method includes the steps of: selecting, by a user employing the graphical user interface, a graph designation; for the graph represented by the selected graph designation, selecting a second horizontal scale for a portion of the horizontal graphical coordinates associated with the selected graph, for providing a second horizontal scale to the selected portion of the horizontal graphical coordinates for the selected graph; and displaying on the visual display device, by the user employing the graphical user interface, the selected graph which has a portion of the horizontal graphical coordinates having the second horizontal scale.

In accordance with another aspect of the invention, the method includes the steps of: recording time frames of the groups of the graphical coordinates, in response to the graphical user interface, wherein the graphical time frames are suitable for graphing; and selecting recorded time frames of the groups of the graphical coordinates, in response to the graphical user interface, for displaying in a graphical display mode on the visual display device.

In accordance with another aspect of the invention, the method includes the steps of: collecting data in real-time; processing data in real-time; and displaying processed data graphically in real-time on the visual display device.

In accordance with another aspect of the invention, the method includes the steps of: collecting data in response to a diagnostic code trigger; processing the data collected in response to the diagnostic code trigger; and displaying/storing the diagnostic-code-triggered-processed data graphically on the visual display device.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS

An embodiment of the computer-readable binary pattern storage apparatus of the invention is a portion of a hand-held computerized analyzer known as the Genisys System manufactured by SPX Corporation.

The Genisys System is an easy-to-use hand-held instrument designed to operate software applications (application programs) developed for automotive diagnostics. A variety of features of the Genisys System are disclosed in additional pending U.S. patent applications. Such U.S. patent applications include U.S. application Ser. Nos. 09/702,751 and 09/702,803, both filed Nov. 1, 2000, the disclosure of which is incorporated herein by reference.

The Genisys System employs an internal operating system that accesses software programs residing in the internal memory. The programs are brought into the internal memory by a number of optional computer-readable binary pattern storage apparatuses which include an external memory card, such as a flash memory card, a smart card, a hardware interface port (HIP) module, a cartridge, and a hard drive, among others. A hardware interface port (HIP) module can be provided to receive a HIP module. The HIP module and cartridge are generally used for backward emulation while the smart card is generally used for security purposes. The Genisys System can also communicate with personal computers through an RS-232 connection and with printers equipped with infrared communication capabilities.

The Genisys System has command keys which allow a user to operate a graphical user interface with the computerized analyzer. The command keys include a power key, function keys, a direction key, and action keys.

The power key turns the power to the computerized analyzer on and off.

The function keys are employed by the user to activate different parts of the applications programs. The functions of the function keys are controlled by the software and change as different parts of a test procedure are displayed on the visual display device of the computerized analyzer. A visual command bar (for selecting a command) is provided on the visual display device, and the direction key permits the user to move the command bar in a left, up, right, or down direction on the visual display device. Once the command bar highlights a desired, command, the user presses an enter key (one of the action keys) to activate the selected command. The operation of the command bar, the direction key, and the enter key is analogous to the operation the scroll keys or a mouse, with pointing and clicking, in a Windows environment.

The action keys activate an action or request an application. The actions keys include a help key, an enter key, a menu key, and an exit key.

The Genisys System is battery powered and includes an external power port for powering tool and recharging the battery.

Additional automotive diagnostic software programs can be added to increase testing capability. Expanded communications and program flash memory updates can also be employed when available. A Universal Serial Bus (USB) protocol adds even more expansion capabilities. Devices such as a keyboard, hard drive, or other USB peripherals can also be employed with the Genisys System.

The Genisys System includes a data link connector for connecting to a data port on an automotive vehicle. A connector cable is used to connect the data link connector to the computerized analyzer portion of the Genisys System.

The computer-readable binary pattern storage apparatus of the invention can be in one or more of the optional computer-readable binary pattern storage apparatuses mentioned above.

In the Genisys System, the Applications Manager is the main menu from which all programs are selected. The menu selections of the Applications Manager include, but is not limited to, the following menu items: cartridge module; Genisys 99; playback; system setup; and self-running demonstration.

When the system setup menu item is selected in the Applications Manager, the system setup menu appears on the visual display device, and the system setup menu includes, but is not limited to, the following menu items: contrast; header; language; printer; power settings; versions; and unit defaults.

When the Genisys 99 menu item is selected from the Applications Manager, the selection activates the Genisys 99 diagnostics program which processes vehicle control system data into an easily readable format for the visual display device, and then makes the formatted data accessible through the Genisys tool. The program reads, graphs, and records sensor and switch input or output (data stream). The program also reads diagnostic trouble codes and performs special tests.

By way of example, when the Genisys 99 menu item is selected from the Applications Manager, the Genisys 99 diagnostics program provides the user with a first vehicle description screen which displays manufacturers. Each unique vehicle has a different selection method. One such method is as follows. Once a manufacturer is selected, a second screen is provided for selection of a make. When the make is selected, a third screen is provided for selection of body type. Once a body type is selected, a fourth screen is provided for selection of carline. Once a carline is selected, a fifth screen is provided for engine. Once an engine is selected a six screen is provided for indicating required cables between the vehicle's onboard computer port and the Genisys System.

When the Genisys System is connected to the vehicle onboard computer, the Genisys 99 diagnostics program tests all On-Board Diagnostics Two (OBD II) applications of vehicles equipped with an OBD II emissions standard system, as well as many OBDI systems. Then, the Genisys 99 diagnostics program initiates the diagnostic process by creating a custom menu that lists tests and procedures available for each vehicle description entered into the program. From the custom diagnostic menu and the function keys, a number of powerful test options can be selected, such as, but not limited to: DATASTREAM; RECORD; DIAGNOSTIC CODES; and SPECIAL TESTS.

The DATASTREAM menu selection enables the user to view vehicle sensor and switch data stream information communicated from the vehicle computer. The sensors can be arranged for side-by-side display on the visual display device and for real-time graphing on the visual display device. Also, the data stream information can be recorded and printed for examination as a document. The key features of the present invention, as explained further below, are accessed through the DATASTREAM menu selection.

Figure 1A:
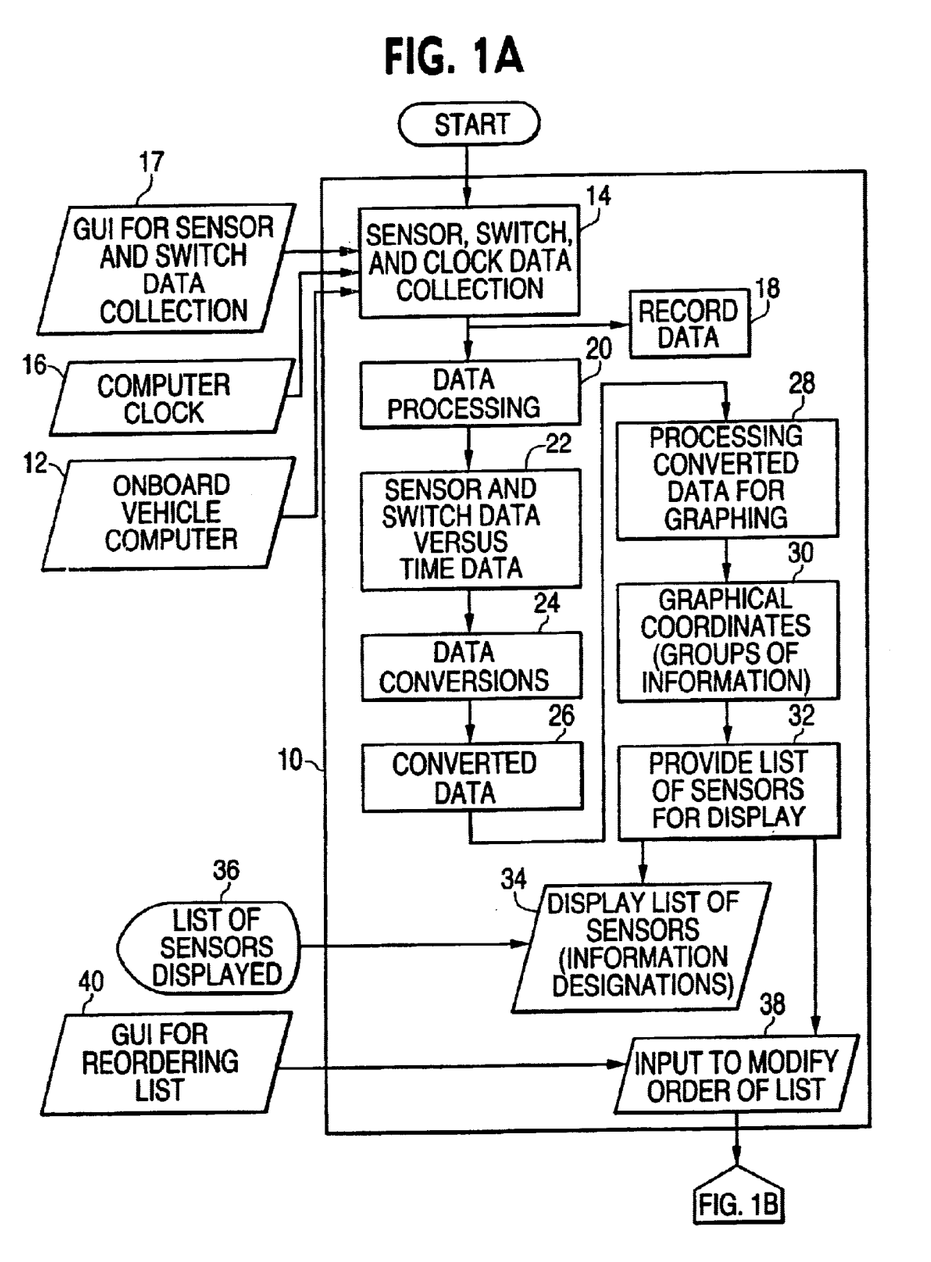
FIGS. 1A, 1B, and 1C together comprise a flowchart depicting the overall data monitoring and analysis method and apparatus of the invention.
Figure 1B:
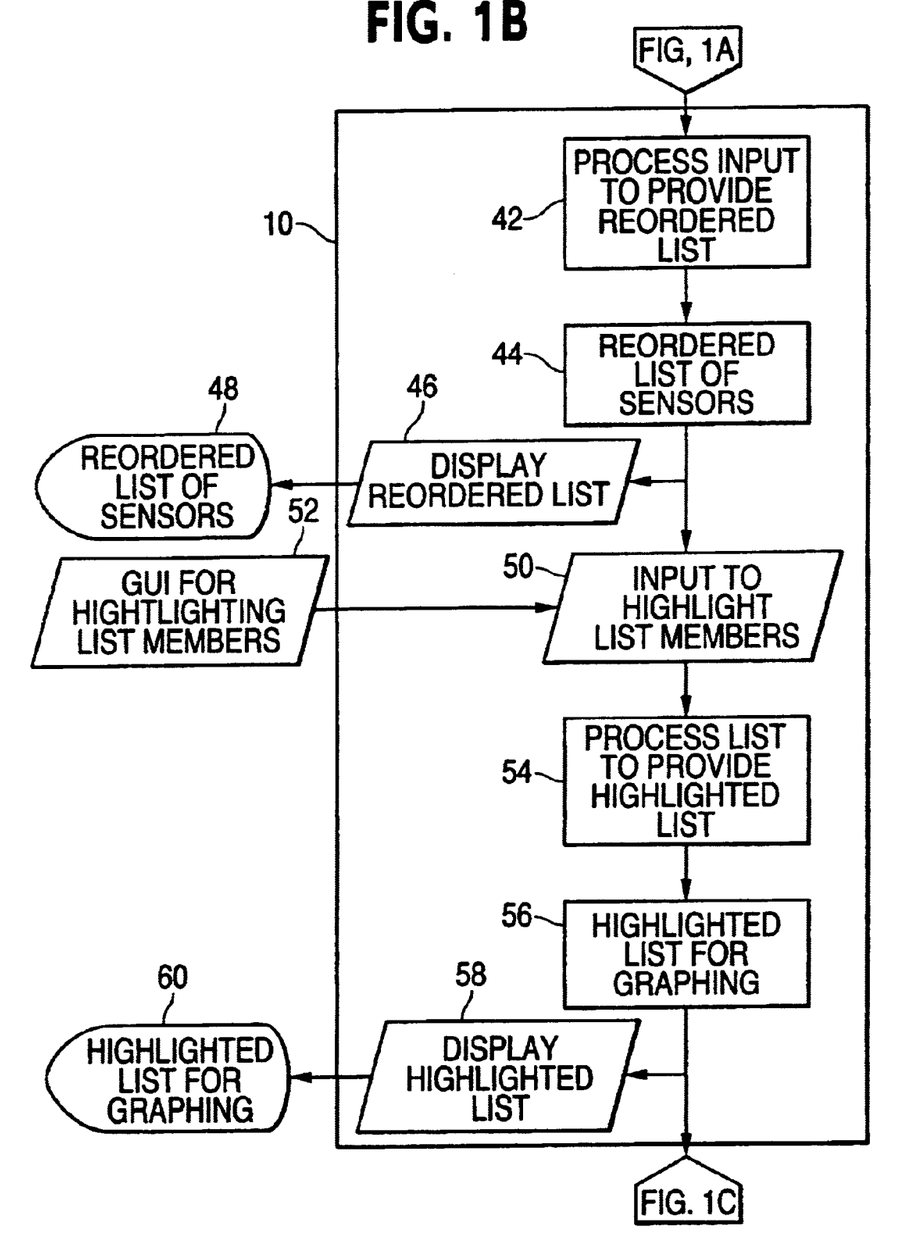
Figure 1C:
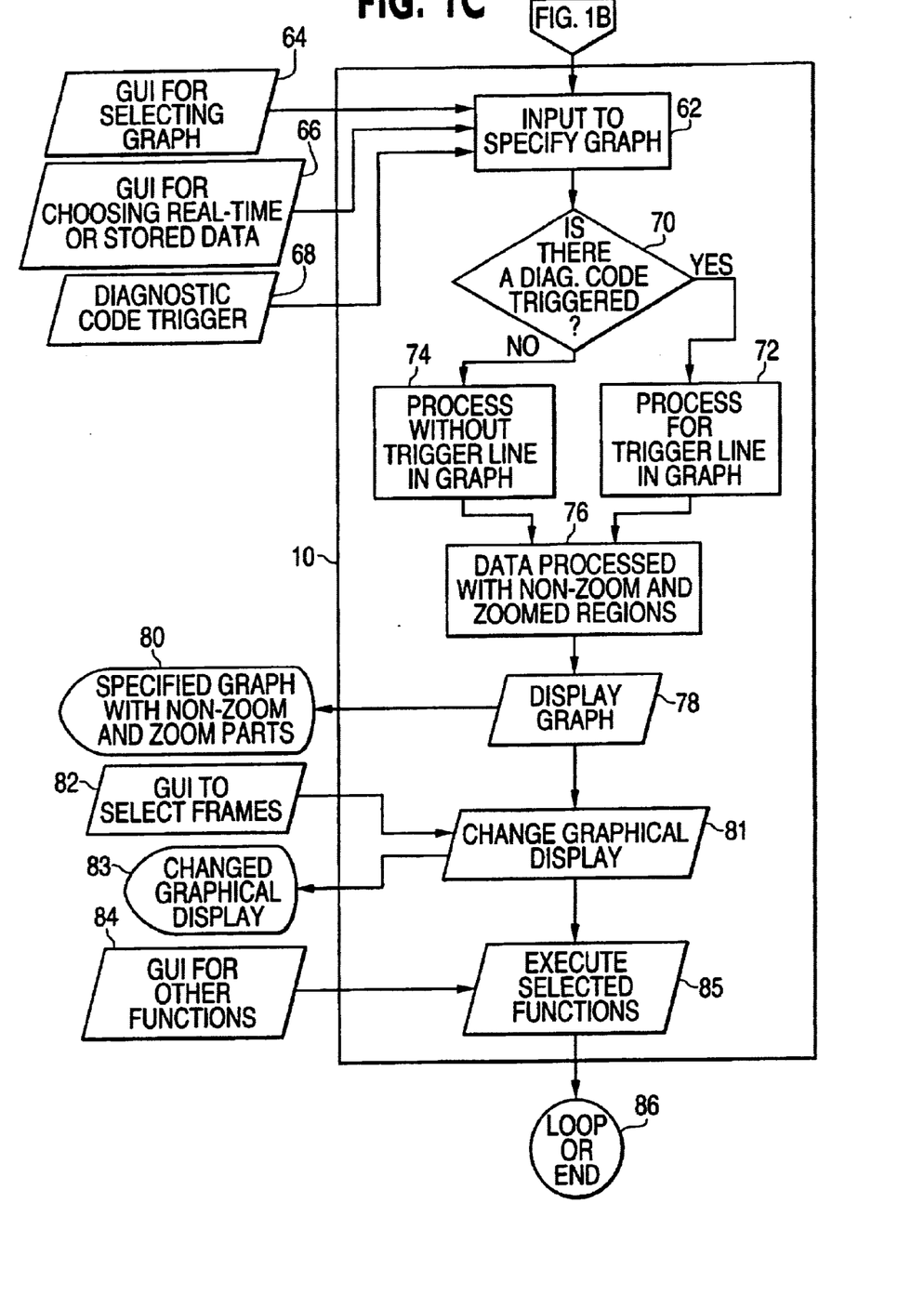

With reference to FIGS. 1A, 1B, and 1C, the overall operation of the data monitoring and analysis method and apparatus of the invention is depicted. The largest block 10 represents a computer-readable binary pattern storage apparatus which can be implemented in a variety of ways, such as an external memory card, such as a flash memory card, a smart card, a hardware interface port (HIP) module, a cartridge, and a hard drive, among others. The computer-readable binary pattern storage apparatus 10 has a plurality of binary patterns constituting an application program executable by a computer which has a central microprocessor, a memory, means for loading the application program into a defined address space of said memory, an operating system providing a graphical user interface, and a visual display controlled by the application program and by a user using the graphical user interface. The computer is connected to a plurality of data channels that are provided by a vehicle onboard computer 12.

The applications program includes a set of executable instructions, represented by block 14, for monitoring and receiving data from the vehicle onboard computer 12 through the data channels, from a computer clock 16, and from the graphical user interface 17 for commanding data collection.

The applications program includes a set of executable instructions, represented by block 18, for storing or recording the collected data on the computer-readable binary pattern storage apparatus 10.

The applications program includes a set of executable instructions, represented by block 20, for processing the collected data and for storing the processed data in files on the computer-readable binary pattern storage apparatus 10, represented by block 22.

The applications program includes a set of executable instructions, represented by block 24, for reading the processed data from block 22 and for converting the processed data into converted files on the computer-readable binary pattern storage apparatus 10, represented by block 26.

The applications program includes a set of executable instructions, represented by block 28, for processing the converted data into coordinates suitable for graphing and for storing the graphical coordinates in files on the computer-readable binary pattern storage apparatus 10, represented by block 30.

The applications program includes a set of executable instructions, represented by block 32, for processing the files of graphical coordinates into a list of sensors and switches that can be graphed. Also, the applications program includes a set of executable instructions, represented by block 34, for displaying the list on the visual display device, represented with this particular display by block 36.

The applications program includes a set of executable instructions, represented by block 38, for receiving commands from the graphical user interface, represented by block 40, for commanding a reordering of the list of sensors provided by block 32.

The applications program includes a set of executable instructions, represented by block 42, for processing the previous list into a reordered list that is stored in files on the computer-readable binary pattern storage apparatus 10, represented by block 44.

The applications program includes a set of executable instructions, represented by block 46, for displaying the reordered list on the visual display device, represented with this particular display by block 48.

The applications program includes a set of executable instructions, represented by block 50, for reading the reordered list from the files represented block 44 and for receiving commands from the graphical user interface, represented by block 52, for highlighting members of the reordered list.

The applications program includes a set of executable instructions, represented by block 54, for processing the commands from the graphical user interface from block 52 in conjunction with the list from block 50 to provide files on the computer-readable binary pattern storage apparatus 10, represented by block 56, which contains processed data for a highlighted list of sensors and switches.

The applications program includes a set of executable instructions, represented by block 58, for displaying the highlighted list on the visual display device, represented with this particular display by block 60.

The applications program includes a set of executable instructions, represented by block 62, for receiving the processed data for a highlighted list of sensors and switches from block 56, for receiving commands from the graphical user interface (represented by block 64) for selecting a sensor or switch to graph, for receiving commands from the graphical user interface (represented by block 66) for choosing between a graphical display of real-time data or stored data, and for receiving commands from a diagnostic code trigger (represented by block 68) for graphing data related to a diagnostic code that has been sensed to be out of specifications.

Figure 4:
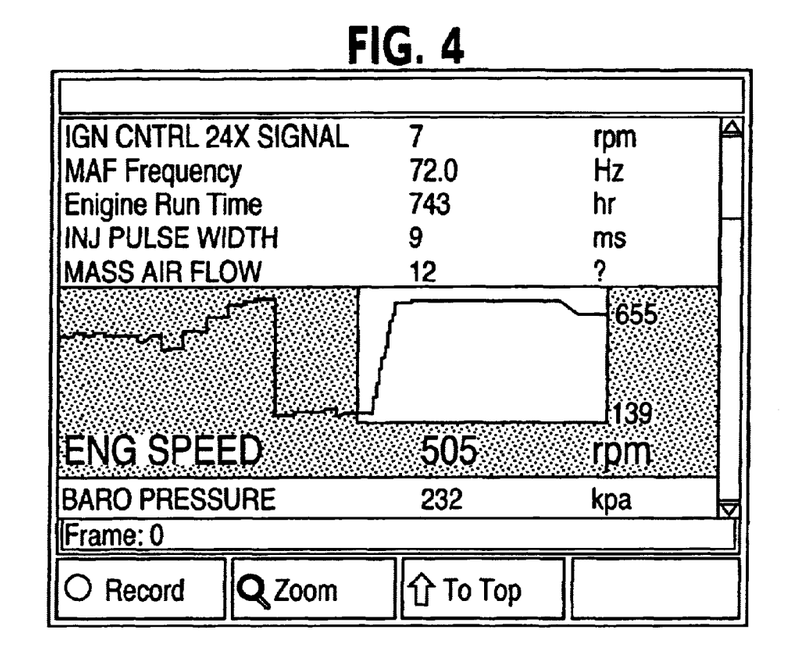
FIG. 4 is a screen shot of the visual display device in which a particular sensor has been selected for graphing, including a zoomed-in portion, and in which the selected graph is displayed on the visual display device.

The applications program includes a set of executable instructions, represented by block 70, for deciding if a graph to be displayed does include a diagnostic code trigger line 11 (see FIG. 5) or does not include a diagnostic code trigger line 11 (see FIG. 4). The applications program includes a set of executable instructions, represented by block 72, for processing a graph to include a diagnostic code trigger line 11. Also, the applications program includes a set of executable instructions, represented by block 74, for processing a graph which does not include a diagnostic code trigger line 11.

The applications program includes a set of executable instructions, represented by block 76, for preparing a graph that includes a non-zoomed-in region and a zoomed-in region. With the non-zoomed-in region, there are vertical graphical coordinates and first horizontal graphical coordinates. With the zoomed-in region, there are the vertical graphical coordinates and second horizontal graphical coordinates. The second horizontal graphical coordinates have a greater scale than the first horizontal graphical coordinates. In this respect, the set of executable instructions, represented by block 76, includes graph scale changing instructions.

The applications program includes a set of executable instructions, represented by block 78, for displaying a graph having at least one non-zoomed-in region and a zoomed-in region on the visual display device, represented with this particular display by block 80. It is noted that a graphical display that include one non-zoomed-in region that precedes the zoomed-in region is shown in FIG. 4.

Figure 5:
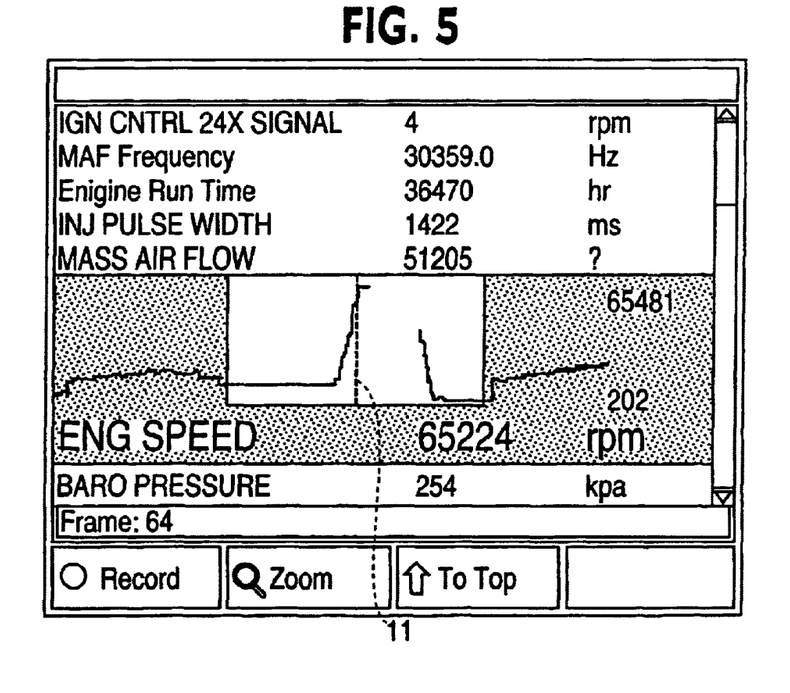
FIG. 5 is a screen shot of the visual display device in which a particular sensor has been selected for graphing, including a zoomed-in portion, and in which the selected graph employs a trigger line in the zoomed-in graph portion.

The applications program includes a set of executable instructions, represented by block 81, which receives graphing coordinates for displaying one non-zoomed-in region and a zoomed-in region on the visual display device (from block 78), and which for receives commands from the graphical user interface, represented by block 82, for selecting graph time frames for display, whereby the visual display device, represented with this particular is display by block 86, displays a graph time frame which includes a first non-zoomed-in region, a middle zoomed-in region, and a second non-zoomed-in region, such as shown in FIG. 5.

Once all of the desired graphs and graph time frames have been displayed, other functions can be commanded by the graphical user interface, represented by the generic block 84, for executing other sets of instructions, represented by generic block 85, which may include instruction for looping the applications program back to another program portion, or the computer can be turned off. Both looping and turning the computer off are represented by circle 86.

Figure 2:
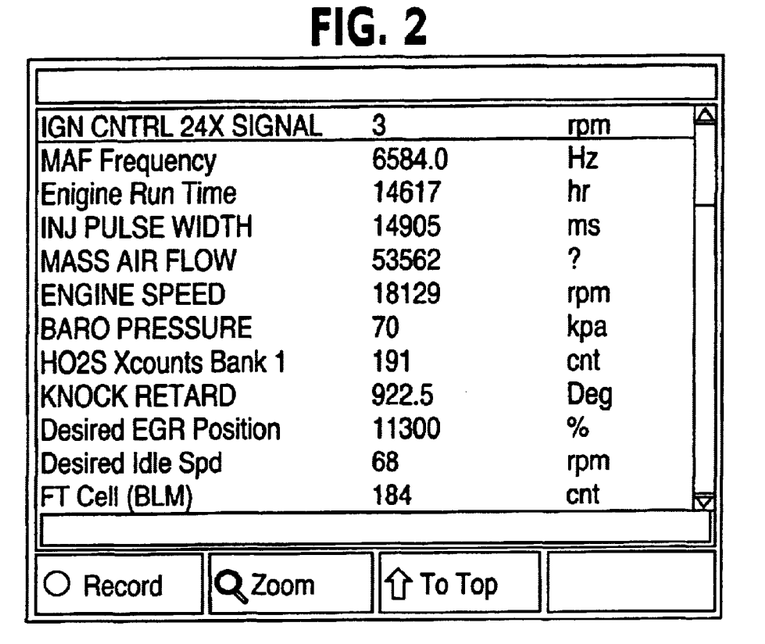
FIG. 2 is a screen shot of the visual display device in which a list of sensors and switches available for data display and graphing is shown and in which a specific selected sensor has been moved to the top of the list.

More specifically with respect to the DATASTREAM menu selection, the data stream is the plurality of electrical signals sent between the vehicle sensors or switches and the vehicle onboard computer. In the computerized analyzer, the data stream is retained (in data buffers), processed, and displayed on the visual display device in a readable format for the technician. In the computerized analyzer, the data stream display format arranges either a preselected group of sensors or all of the sensors and switches detected on the vehicle in alphabetical order on the visual display device. Once the detected sensors and switches have been displayed on the visual display device in alphabetical order, the technician can arrange the order of the sensors and switches in any desired order. To do so, the technician highlights the desired sensor or switch. Then, the technician presses the To Top function key. This results in the selected sensor or switch being moved to the top of the list on the visual display device. See FIG. 2. Another feature is the ability to sort by alphabetical, graphed items, and active items.

Figure 3:
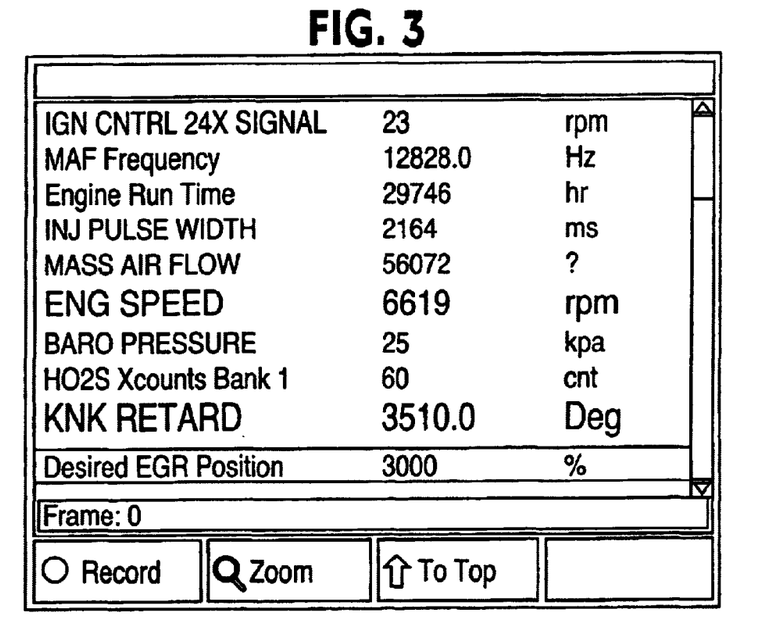
FIG. 3 is a screen shot of the visual display device in which selected sensors for data display and graphing are shown in highlighted (enlarged) alphanumeric characters.

Once the sensors or switches have been placed in the desired order on the visual display device, a number of options are available which permit data stream review and amplification. These options include: highlighting (by enlarging) selected sensors or switches; recording data; zooming to increase the viewable data window; graphing to visually enhance data interpretation; displaying configuration to enable sensor comparison; and printing to capture data on paper. Highlighted information designations (by enlarged sensor list entries) for the sensors for engine speed and crankshaft retard are enlarged in FIG. 3.

With respect to the function of recording data, either during road testing or stationary testing, the record function continuously receives data streams through the data channels to create a recording of sensor or switch activity. This sensor or switch activity can be viewed in real-time as a graph, or the sensor or switch activity can be retained for detailed examination at a later time. The sensor or switch activity can also be saved as a file.

Two methods are available to capture data or sensor information generated during road or stationary testing: automatic recording; and diagnostic-code-triggered recording.

With automatic recording, the sensors that are graphed on the visual display device automatically display past and present data. The past data is read from the data buffers in the computerized analyzer. If desired, the record key is pressed to capture and hold sensor data that occurred before and after the time the record key was pressed.

With diagnostic-code-triggered recording, sensor data is automatically recorded before (from buffered data) and after a trouble code is generated. To view a diagnostic-code-triggered recording, the menu key is pressed to return the user to the Applications Manager menu. Then, the playback menu selection is selected, and the enter key is pressed. A list of recorded files is displayed on the visual display device, and the desired recorded file is selected, and the enter key is pressed. The direction key can then be used. Pushing the direction key to the left causes earlier frames to be viewed in sequence. Pushing the direction key to the right causes later frames to be displayed in sequence.

When automatic recording is to be employed, the following steps are taken. A particular sensor or switch is selected using the visual command bar, and the record function key is pressed to instantly create a series of files for the selected sensor or switch. To view an automatic recording, the menu key is pressed to return the user to the Applications Manager menu. Then, the playback menu selection is selected, and the enter key is pressed. A list of recorded files is displayed on the visual display device, and the desired recorded file is selected, and the enter key is pressed. The direction key can then be used. Pushing the direction key to the left causes earlier frames to be viewed in sequence. Pushing the direction key to the right causes later frames to be displayed in sequence.

Sensor data is retrieved continuously sent from the vehicle onboard computer to the computerized analyzer. To review the most recent data captured by the computerized analyzer, the left side of the directional key is pressed. Then, the data is frozen instantly. If one continues to press the left side of the directional key, earlier recorded data is presented on the visual display device in a frame-by-frame presentation. When the exit key is pressed, a live, real-time presentation is displayed on the visual display device.

To save a recorded file so that it can be retrieved and studied later, the menu key is pressed. This takes the visual display device back to the Applications Manager menu. Then, the playback menu item is selected, and the enter key is pressed. Then, the event file is selected, and the save function key is pressed. Then, a diskette icon appears to the left of the name of the saved file.

To delete a recorded file, the event file is selected, and the delete key is pressed to delete the selected file.

The zoom function displays a graph for a selected sensor or switch, magnifies the label for an information designation during graphing, and magnifies a portion of a displayed graph for the associated information designation.

As shown in FIG. 4, a graph for engine speed is shown. Generally, a graph displays sensor data in a continuously updated graph. As shown in FIG. 4, the graph display on the visual display device provides a graph divided into two graphical window zones. A first graphical window zone is shown on the left side of the graph, and the first graphical window zone depicts past activity of the respective sensor. A second graphical window zone depicts magnified real-time sensor activity. Within the magnified graphical window zone, a dotted line trigger point can be moved over the data line to freeze and magnify any part of the captured data. As data is graphed, the minimum and maximum sensor measurements are displayed along with the current measurements. To bring graphs to the visual display device, the following steps are followed. In a list of information designations, a sensor to be graphed is selected with the visual command bar, and the enter key is pressed. To toggle the graph function on and off, the enter key is pressed again. To toggle graph magnification on and off, the zoom key is pressed multiple times.

Alternatively, as shown in FIG. 5, a graph can display sensor data by virtue of the location of a trigger line displayed on the respective graph. The magnified portion of a graph is displayed both before and after the trigger line. The position of the trigger line on the respective graph is selected by using the direction key and pressing the direction key to the right or left to move the trigger line to the right or left along the graph. With the use of the trigger line, the graphed data is both magnified and frozen. To return to real-time data graphing, the exit key is pressed.

By pressing the RECORD function key, data is quickly captured that occurs before and after the function key is pressed. Also, the RECORD function key also provides for viewing a file that is recorded when a diagnostic trouble code is detected.

The DIAGNOSTIC CODES menu selection enables the user to view diagnostic trouble codes set by the onboard vehicle computer. Also, the Genisys 99 diagnostics program can view pending codes to see if a trouble code is about to be set. Also, the Genisys 99 diagnostics program lists the General Motors OBD II trouble code designations of A, B, C, and D to help lead a technician through problem diagnoses in order of importance. The DIAGNOSTIC CODES menu selection also enables the user to clear diagnostic codes in the vehicle onboard computer. Through the DIAGNOSTIC CODES menu selection, the Genisys 99 diagnostics program also provides a freeze frame option which shows a frame of sensor data that is captured at the moment a trouble code is set in the vehicle onboard computer. Through the DIAGNOSTIC CODES menu selection, the Genisys 99 diagnostics program reads codes recorded in the vehicle onboard computer for the following tests: key-on, engine-off self-test; key-on, engine-off injector buzz test; key-on, engine-off output relays test; key-on, engine-running test; key-on, engine-running glowplug test; key-on, engine-running cylinder contribution test; and key-on, engine-running switch test.

The SPECIAL TESTS menu selection initiates many specific tests for vehicle sensors as well as controlling General Motors bi-directional devices and viewing the immediate sensor reactions on the visual display device. Through the SPECIAL TESTS menu selection, the Genisys 99 diagnostics program conducts tests specific for the vehicle being tested. These tests are, but not limited to, the following: readiness status; drive cycle; oxygen sensor test; component parameters (e.g. catalyst or evaporative system); output controls (e.g. hi-speed fan on, low-speed fan on, all outputs on); evaporative system leak test; engine controls (e.g. air pump control, crankshaft variable learn, fan on/off, high fan control, low fan control, idle air control position, idle speed control, spark retard control, and starter inhibit control); evaporative emission controls (e.g. canister purge solenoid control, canister vent solenoid control, exhaust gas recirculation control, exhaust gas recirculation vent solenoid control, and evaporative service bay test); fuel system controls (e.g. fuel pump relay, fuel injector disable, fuel closed loop control, and fuel trim reset); and diesel controls (e.g. boost control solenoid, fuel injection timing control, engine shutoff solenoid, and glow plug relay control).

The SPECIAL TESTS menu selection also initiates the following tests. These tests are, but not limited to, the following: engine indicator lamps control (e.g. alternator lamp control, change oil lamp control, check gauges lamp control, engine hot lamp control, low coolant lamp control, MIL lamp control, oil level lamp control, oil pressure lamp control, and service throttle soon lamp control); transmission controls (e.g. pressure control solenoid, reverse inhibit control, torque converter clutch control, transmission gear control, 3–2 control solenoid, preset or reset adaptive parameters control, and skip shift control); transmission indicator lamps control (e.g. 1–4 shift lamp control, 2nd gear start lamp control, shift lamp control, and up-shift lamp control); accessory controls (e.g. air conditioning clutch relay, alternator L-terminal control, and cruise inhibit); engine actuator tests; idle air control; enable/disable tests for different actuators; minimum air idle speed; emission maintenance reminder (EMR) lamp reset; set timing synchronization mode; reset idle air control; reset adaptive fuel adjustment; reset minimum throttle position sensor; reset flexible fuel percent; enable door lock; disable door lock; display of specific vehicle information; vehicle computer identification test; and display of vehicle and system identification information.

After repairs have been completed, the repairs can be verified with Drive Cycle Enable Criteria. A specific Vehicle System Monitor can be activated to verify the repairs. Alternatively, a Full Drive Cycle can be performed to enable all Vehicle System Monitors.

Another feature of the Genisys 99 diagnostics program is the ability to emulate another computerized analyzer. More specifically, using a cartridge containing OTC Pathfinder '99, of OTC/SPX Corporation, Owatonna, Minn., the visual display device emulates an Enhanced Monitor 4000 unit. One special feature of the Enhanced Monitor 4000 unit is the display of an on-screen keyboard that permits menu choices and function choices.

It is apparent from the above that the present invention accomplishes all of the objects set forth by providing a new and improved data monitoring and analysis method and apparatus that provides a hand-held analyzer having the capabilities of a stand alone analyzer for complex data receiving and complex data processing. With the invention, a data monitoring and analysis method and apparatus is provided which permits a technician to focus on one or a small number of data channels at a time. With the invention, a data monitoring and analysis method and apparatus is provided which permits a technician to readily change the order of available graphs. With the invention, a data monitoring and analysis method and apparatus provides a way for selected data channels to be highlighted or distinguished from other members of the displayed list of data channels. With the invention, a data monitoring and analysis method and apparatus provides a graphical display in which the time scale can be changed for a portion of the horizontal axis. With the invention, a data monitoring and analysis method and apparatus is provided which can display a graph that has a first portion of the graph, which employs a first time scale, and which has a second portion of the graph, which employs a zoomed-in time scale.

The above description and drawings are only illustrative of preferred embodiments which achieve the objects, features, and advantages of the present invention, and it is not intended that the present invention be limited thereto. Any modification of the present invention which comes within the spirit and scope of the following claims is considered to be part of the present invention.

What is claimed is:

1. An vehicle diagnostic tool, comprising:
   a data link connector that receives data from an onboard vehicle computer;
   a processor linked to said data link connector wherein said processor executes a diagnostic application program on said data received at said data link connector; and
   a display linked to said processor wherein an output diagnostic data generated by said processor running said diagnostic application program is graphically displayed;
   wherein said diagnostic application program generates a non-zoomed-in region and a zoomed-in region and simultaneously displays said non-zoomed-in region and said zoomed-in region on said display for a selected item of the output diagnostic data, said zoomed-in region having graphical coordinates on one axis greater than the graphical coordinates of the non-zoomed-in region on the same axis.

2. The vehicle diagnostic tool of claim 1 wherein said zoomed-in region has graphical coordinates on the horizontal axis that are greater than the graphical coordinates of the non-zoomed-in region on the horizontal axis.

3. The vehicle diagnostic tool of claim 1 further comprising a memory device on which the diagnostic application program is stored.

4. The vehicle diagnostic tool of claim 3 wherein said memory device is a hard drive.

5. The vehicle diagnostic tool of claim 1 wherein said zoomed-in region of said graphical display can be toggled on and off.

6. The vehicle diagnostic tool of claim 5 wherein the magnitude of the coordinates in the non-zoomed-in region and the zoomed-in region can be selected.

7. The vehicle diagnostic tool of claim 1 wherein said non-zoomed-in and zoomed-in regions are differentiated on the display.

8. The vehicle diagnostic tool of claim 7 wherein said zoomed-in region and said non-zoomed in region are overlaid on different color backgrounds on said graphical display.

9. A method of displaying diagnostic data, comprising:
   receiving data from an onboard vehicle computer;
   storing said received data;
   executing a diagnostic application program on said data received from said onboard vehicle computer to generate output diagnostic data; and
   graphically displaying said output diagnostic data in a non-zoomed-in region simultaneously with a zoomed-in region for a selected item of said output diagnostic data, said zoomed-in region having graphical coordinates on one axis greater than the graphical coordinates of the non-zoomed-in region on the same axis.

10. The method of claim 9 wherein said zoomed-in region has graphical coordinates on the horizontal axis that are greater than the graphical coordinates of the non-zoomed-in region on the horizontal axis.

11. The method of claim 9 further comprising the step of toggling said zoomed-in region of said graphical display on and off.

12. The method of claim 11 further comprising the step of selecting the magnitude of the coordinates in the non-zoomed-in region and the zoomed-in region.

13. The method of claim 12 further comprising the step of displaying a first background color in the non-zoomed in region and a second color in the zoomed-in region.

14. The method of claim 9 wherein the step of executing the diagnostic application program further comprises the steps of:
   executing the diagnostic application program on said stored data received from the onboard vehicle computer; and
   executing the diagnostic application program in real-time on said stored data received from the onboard vehicle computer.

15. An vehicle diagnostic tool, comprising:
   a data input means for receiving data from an onboard vehicle computer;
   a processor means linked to said data input means for executing a diagnostic application program on said data received at said data input means; and a display means linked to said processor for graphically displaying output diagnostic data generated by said processor running said diagnostic application program;

wherein said diagnostic application program generates a non-zoomed-in region and a zoomed-in region and simultaneously displays said non-zoomed-in region and said zoomed-in region on said display for a selected item of said output diagnostic data, said zoomed-in region having graphical coordinates on one axis greater than the graphical coordinates of the non-zoomed-in region on the same axis.

16. The vehicle diagnostic tool of claim 15 wherein said zoomed-in region has graphical coordinates on the horizontal axis that are greater than the graphical coordinates of the non-zoomed-in region on the horizontal axis.

17. The vehicle diagnostic tool of claim 15 further comprising a memory means on which the diagnostic application program is stored.

18. The vehicle diagnostic tool of claim 15 wherein said zoomed-in region of said graphical display can be toggled on and off.

19. The vehicle diagnostic tool of claim 15 wherein said diagnostic application program is executed in real-time on stored data and received from said onboard vehicle computer in order to generate said graphical display of the diagnostic data.

20. The vehicle diagnostic tool of claim 19 wherein said zoomed-in region is overlaid on a different background from said non-zoomed-in region.

* * * * *

UNITED STATES PATENT AND TRADEMARK OFFICE
CERTIFICATE OF CORRECTION

PATENT NO.   : 6,640,166 B2
DATED        : October 28, 2003
INVENTOR(S)  : Troy J. Liebl et al.

It is certified that error appears in the above-identified patent and that said Letters Patent is hereby corrected as shown below:

Title page,
Item [56], References Cited, U.S. PATENT DOCUMENTS, include the following patents:

| | | | | |
|---|---|---|---|---|
| -- | 5,428,388 | 6/1995 | Von Bauer et al. | 348/155 |
| | 5,459,489 | 10/1995 | Redford | 345/179 |
| | 4,739,323 | 4/1988 | Miesterfeld et al. | 340/825.5 |
| | 4,975,846 | 12/1990 | Abe et al. | 364/424.03 |
| | 4,962,456 | 10/1990 | Abe et al. | 364/431.01 |
| | 4,975,847 | 12/1990 | Abe et al. | 364/424.03 |
| | 5,003,477 | 3/1991 | Abe et al. | 364/424.03 |
| | 5,056,023 | 10/1991 | Abe | 364/424.03 |
| | 5,132,905 | 7/1992 | Takai et al. | 364/424.03 |
| | 5,150,048 | 9/1992 | McAuliffe et al. | 324/158 |
| | 5,319,962 | 6/1994 | Kaminski et al. | 73/116 |
| | 5,416,917 | 5/1995 | Adair et al. | 395/500 |
| | 5,442,553 | 8/1995 | Parrillo | 364/424.04 |
| | 5,459,660 | 10/1995 | Berra | 364/424.03 |
| | 5,555,498 | 9/1996 | Berra et al. | 364/424.03 |
| | 5,815,071 | 9/1998 | Doyle | 340/439 |
| | 5,848,064 | 12/1998 | Cowan | 370/338 |
| | 5,737,711 | 4/1998 | Abe et al. | 701/29 |
| | 5,884,202 | 3/1999 | Arjomand | 701/29 |
| | 5,922,037 | 7/1999 | Potts | 701/29 |
| | 6,087,605 | 7/2000 | Heidenfels et al. | 200/345 |
| | 5,957,270 | 9/1999 | Ahn | 200/331 |
| | 6,011,227 | 1/2000 | Yoneyama | 200/344 -- |

Signed and Sealed this

Thirtieth Day of March, 2004

JON W. DUDAS
*Acting Director of the United States Patent and Trademark Office*